(12) United States Patent
Cha et al.

(10) Patent No.: US 12,009,414 B2
(45) Date of Patent: Jun. 11, 2024

(54) SUPERCONDUCTOR GATE SEMICONDUCTOR FIELD-EFFECT TRANSISTOR

(71) Applicant: INTERNATIONAL BUSINESS MACHINES CORPORATION, Armonk, NY (US)

(72) Inventors: Eunjung Cha, Adliswill (CH); Cezar Bogdan Zota, Rueschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 47 days.

(21) Appl. No.: 17/542,322

(22) Filed: Dec. 3, 2021

(65) Prior Publication Data
US 2023/0178641 A1    Jun. 8, 2023

(51) Int. Cl.
*H01L 29/778* (2006.01)
*H01L 21/285* (2006.01)
*H01L 21/3213* (2006.01)
*H01L 29/40* (2006.01)
*H01L 29/41* (2006.01)
*H01L 29/423* (2006.01)
*H01L 29/43* (2006.01)
(Continued)

(52) U.S. Cl.
CPC .......... *H01L 29/778* (2013.01); *H01L 29/401* (2013.01); *H01L 29/413* (2013.01); *H01L 29/42316* (2013.01); *H01L 29/437* (2013.01); *H01L 29/475* (2013.01); *H01L 29/66462* (2013.01); *H01L 21/28581* (2013.01); *H01L 21/28587* (2013.01); *H01L 21/32136* (2013.01)

(58) Field of Classification Search
None
See application file for complete search history.

(56) References Cited

U.S. PATENT DOCUMENTS

| 6,774,463 B1 | 8/2004 | Chaudhari et al. |
| 10,784,433 B2 | 9/2020 | Fong et al. |
(Continued)

FOREIGN PATENT DOCUMENTS

| JP | S6425485 A | 1/1989 |
| JP | H09162449 A | * 6/1997 |
| JP | H09205197 A | 8/1997 |

OTHER PUBLICATIONS

English translation of "JP H09162449 A, Manufacture of Semiconductor-Coupled Superconductive Element" (Year: 1997).*
(Continued)

*Primary Examiner* — Khaja Ahmad
(74) *Attorney, Agent, or Firm* — Intelletek Law Group, PLLC; Gabriel Daniel, Esq.

(57) ABSTRACT

A transistor structure, includes a buffer layer and a quantum well channel layer on top of the buffer layer. There is a barrier layer on top of the channel layer. There is a drain contact on a channel stack. A source contact is on a channel stack. A gate structure is located between the source contact and drain contact, comprising: an active gate portion having a bottom surface in contact with a bottom surface of the source and the drain contacts. A superconducting portion of the gate structure is in contact with, and adjacent to, an upper part of the active gate portion.

8 Claims, 13 Drawing Sheets

(51) Int. Cl.
*H01L 29/47* (2006.01)
*H01L 29/66* (2006.01)

(56) References Cited

U.S. PATENT DOCUMENTS

| | | | | |
|---|---|---|---|---|
| 2002/0149032 | A1* | 10/2002 | Ouchi | H01L 29/7783 |
| | | | | 257/E29.249 |
| 2016/0163845 | A1* | 6/2016 | Endoh | H01L 29/66462 |
| | | | | 257/194 |
| 2017/0018617 | A1* | 1/2017 | Xia | H01L 29/7786 |
| 2017/0084717 | A1* | 3/2017 | Fan | H01L 29/42316 |
| 2018/0337242 | A1* | 11/2018 | Yang | H01L 29/66446 |
| 2020/0152750 | A1 | 5/2020 | Morrow et al. | |
| 2020/0168724 | A1 | 5/2020 | Huang et al. | |

OTHER PUBLICATIONS

Myer, L. O. A., et al: "A Comparative Study of the Noise Performance of Aluminium-Gallium-Arsenide/Gallium-Arsenide High Electron Mobility Transistors with and without Superconducting Gate Electrodes", IEEE Electron Device Letters (1992); vol. 13:5, pp. 273-275.

Myers, L. et al., "Improvement in Resolution and Reproducibility using the Polymethylmethacrylate/ Polymethylacrylic Acid Bilayer System", Journal of Vacuum Science & Technology B (1986), vol. 4:5, pp. 1259-1260.

Mimura, T. et al., "A New Field-Effect Transistor with Selectively Doped GaAs/n-AlxGal-xAs Heterojunctions", Japanese Journal of Applied Physics (1980), vol. 19:5, pp. L225-L227.

International Search Report and Written Opinion dated Mar. 28, 2023 in related international application No. PCT/EP2022/083956, 19 pgs.

Cheng, P. et al., "Room-Temperature Field Effect Transistors with Metallic Ultrathin TiN-Based Channel Prepared by Atomic Layer Delta Doping and Deposition"; Scientific Reports (2017); vol. 7:875; 9 pgs.

Rocci, M. et al., "Gate-Controlled Suspended Titanium Nanobridge Supercurrent Transistor"; arXiv:2006.07091v2 [cond-mat.mes-hall] (2021); 22 pgs.

* cited by examiner

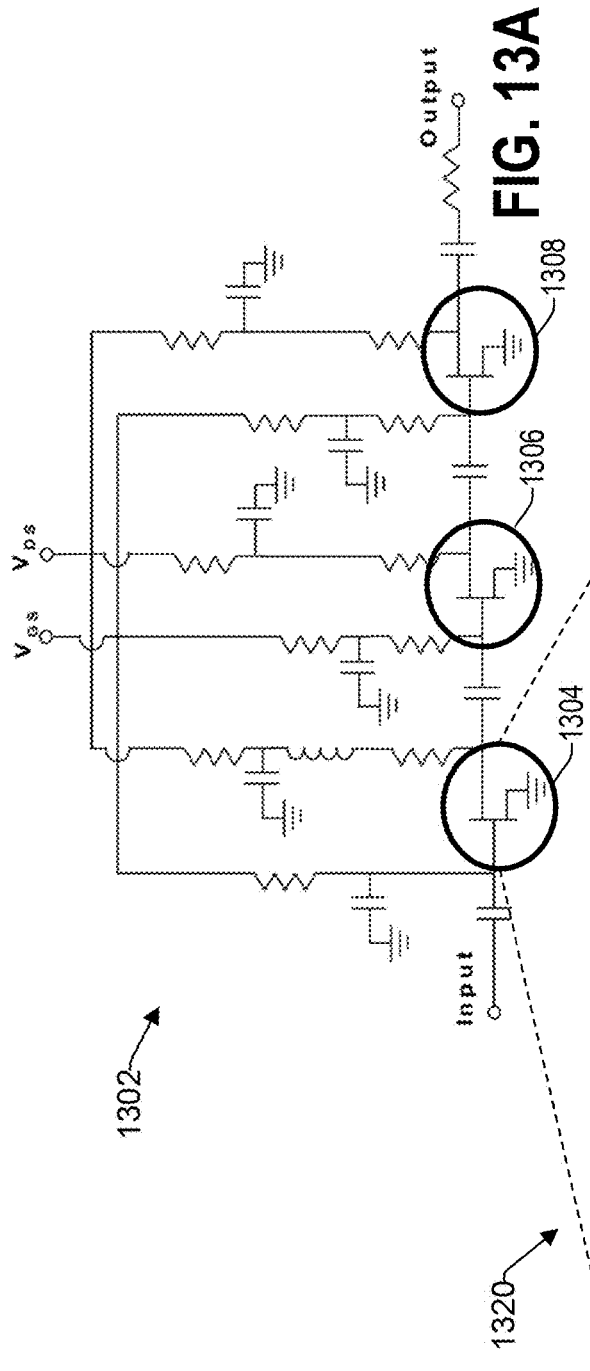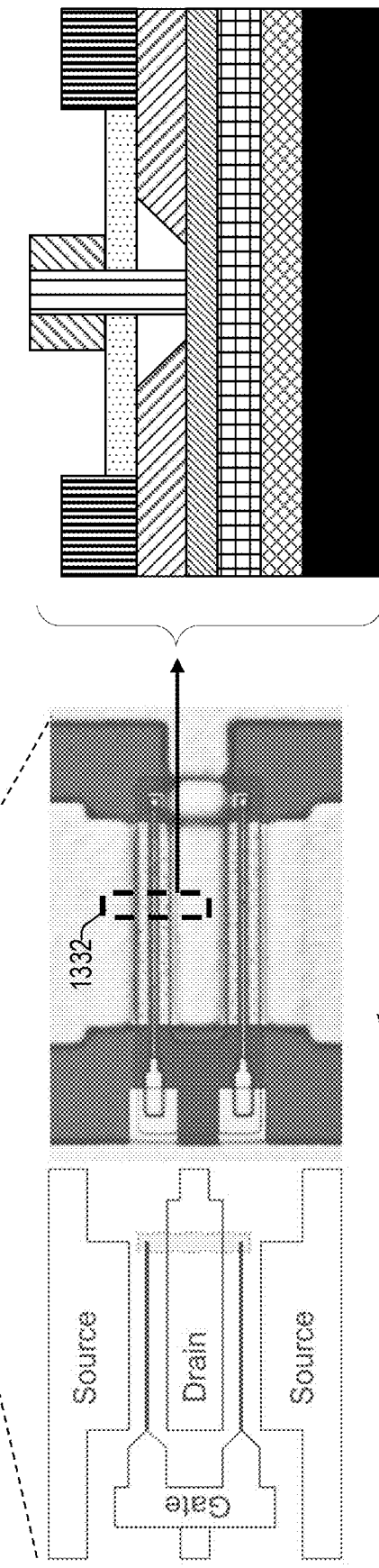
FIG. 13A
FIG. 13B
FIG. 13C
FIG. 13D

SUPERCONDUCTOR GATE SEMICONDUCTOR FIELD-EFFECT TRANSISTOR

BACKGROUND

Technical Field

The present disclosure generally relates to superconducting structures, and more particularly, to superconducting transistor structures and methods of creation thereof.

Description of the Related Art

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state. Various components, such as low-noise amplifiers, that may operate in different thermal isolation stages, can be used to communicate with qubits. Many quantum phenomena, such as superposition and entanglement, do not have analogs in the world of classical computing and therefore may involve special structures, techniques, and materials.

SUMMARY

According to an embodiment, a transistor structure includes a buffer layer and a quantum well channel layer on top of the buffer layer. There is a barrier layer on top of the channel layer. There is a drain contact on a channel stack. A source contact is on a channel stack. A gate structure is located between the source contact and drain contact, comprising: an active gate portion having a bottom surface in contact with a bottom surface of the source and the drain contacts. A superconducting portion of the gate structure is in contact with, and adjacent to, an upper part of the active gate portion.

In one embodiment, the buffer layer is Indium-Aluminum-Arsenide (InAlAs), the quantum well channel layer is Indium-Gallium-Arsenide (InGaAs), and the barrier layer is Indium-Aluminum-Arsenide (InAlAs).

In one embodiment, the source and drain each have a tapered shape facing the gate.

In one embodiment, the superconductor material is titanium nitride (TiN).

In one embodiment, a width of the superconductor material of the left portion and the right portion of the gate structure are each below 50 nm.

In one embodiment, there is a dielectric layer, such as silicon dioxide ($SiO_2$), between the drain contact and the left portion of the gate structure. There is an $SiO_2$ layer between the source contact and the right portion of the gate structure.

In one embodiment, the gate structure is I shaped.

In one embodiment, the source and drain contacts comprise n+ Indium-Gallium-Arsenide (InGaAs) cap.

In one embodiment, the superconductor transistor structure is a high-electron-mobility transistor (HEMT) and part of a low noise amplifier configured to operate in a cryogenic environment.

According to an embodiment, a method of fabricating superconductor transistor structure includes providing a buffer layer, a quantum well channel layer on top of the buffer layer, a barrier layer on top of the channel layer, and a contact layer on top of the barrier layer. A $SiO_2$ layer is provided on top of the contact layer. A first photoresist layer having an opening on top of the $SiO_2$ layer is provided. A portion of the $SiO_2$ layer under the opening of the first photoresist layer is removed. Additional portions of the contact layer under the opening of the first photoresist layer are removed to create a cavity and separate a left portion of the contact layer from a right portion of the contact layer. The first photoresist layer is removed. A gate metal is deposited from the top surface of the barrier layer to above the $SiO_2$ layer having an I structure. A superconductor material is deposited on top of the $SiO_2$ layer and the gate metal. The superconductor material is removed except from a portion abutting the left side of the gate metal and a portion abutting the right side of the gate metal.

In one embodiment, a second photoresist layer is provided on top of a portion of the $SiO_2$ layer, a top of the superconducting material on the left side of the gate metal, the right side of the gate metal, and on top of the gate metal. A third photoresist layer is deposited on top of the second photoresist layer. A left portion of the $SiO_2$ layer and a right portion of the $SiO_2$ layer left open by the third photoresist layer are removed. The second and third photoresist layers are then removed. An ohmic metal is provided on top of a left portion and a right portion of the contact layer where the $SiO_2$ layer were removed.

In one embodiment, the buffer layer comprises Indium-Aluminum-Arsenide (InAlAs).

The quantum well channel layer comprises Indium-Gallium-Arsenide (InGaAs).

In one embodiment, the barrier layer comprises Indium-Aluminum-Arsenide (InAlAs). The contact layer comprises n+ InGaAs.

In one embodiment, the buffer layer, the quantum well channel layer, the barrier layer, and the contact layer are each constructed by molecular-beam epitaxy (MBE).

In one embodiment, the opening of the first photoresist layer has a lateral width of 30 nm to 300 nm.

In one embodiment, the cavity is created by a wet etching of the contact layer through the opening.

In one embodiment, the gate metal is deposited by an evaporation and lift-off process.

In one embodiment, the gate metal is constructed of titanium (Ti) having a thickness of 20 nm; platinum (Pt) having a thickness of 10 nm; or gold (Au) having a thickness of 30 nm.

In one embodiment, the superconductor material is TiN.

In one embodiment, the deposition of the superconductor material on top of the $SiO_2$ layer and the gate metal is by atomic layer deposition (ALD).

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIG. 13A provides an example low noise amplifier circuit that may use one or more transistors similar to that of FIG. 12, consistent with an illustrative embodiment.

FIG. 13B provides a top view of an example high-electron-mobility transistor that may be used to implement one or more transistors similar to that of FIG. 12, consistent with an illustrative embodiment.

FIG. 13C is a top photograph view of a high-electron-mobility transistor, consistent with an illustrative embodiment.

FIG. 13D is a simplified cross-section view of a superconductor gate semiconductor field-effect transistor, consistent with an illustrative embodiment.

DETAILED DESCRIPTION

Overview

Figure 1:
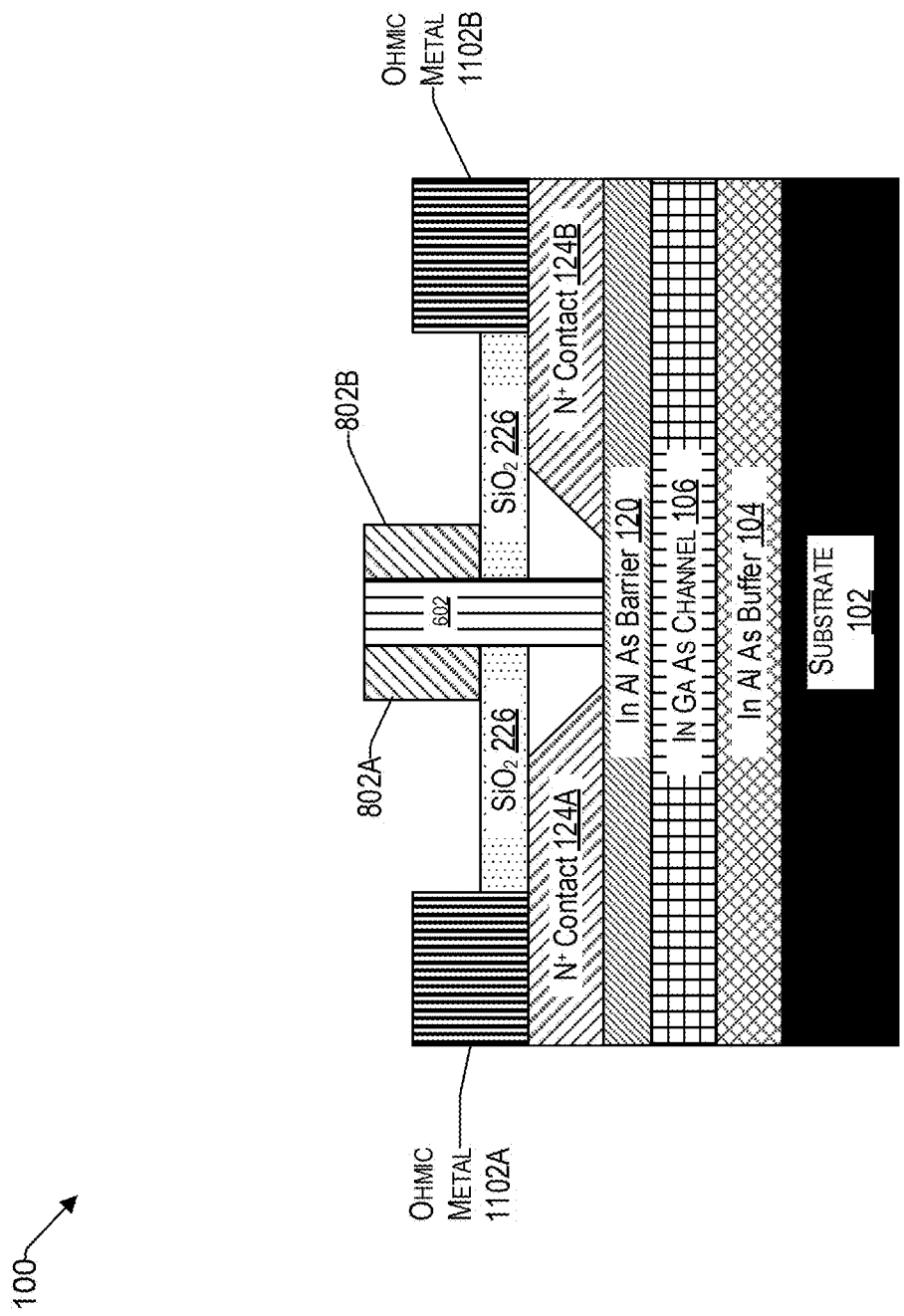
FIG. 1 is a simplified cross-section view of a superconductor gate semiconductor field-effect transistor, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a chip.

As used herein, the term "vertical" describes an orientation that is arranged perpendicular to the first surface of a chip, chip carrier, or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

As used herein, certain terms are used indicating what may be considered an idealized behavior, such as, for example, "lossless," "superconductor," or "superconducting," which are intended to cover functionality that may not be exactly ideal but is within acceptable margins for a given application. For example, a certain level of loss or tolerance may be acceptable such that the resulting materials and structures may still be referred to by these "idealized" terms.

The concepts herein relate to quantum technology and quantum chips. Regarding quantum technology, the electromagnetic energy associated with a qubit can be stored, for example, in so-called Josephson junctions and in the capacitive and inductive elements that are used to form the qubit. In other examples, there may be spin qubits coupled to resonators or topological qubits, microfabricated ion traps, etc. Other types of superconducting components are supported by the teachings herein as well, including (without limitation), circulators, isolators, amplifiers, filters, active control electronics such as rapid single flux quantum (RSFQ), etc.

In one example, to read out the qubit state, a microwave signal is applied to the microwave readout cavity that couples to the qubit at the cavity frequency. The transmitted (or reflected) microwave signal goes through multiple thermal isolation stages and low-noise amplifiers (LNAs) that are used to block or reduce the noise and improve the signal-to-noise ratio. Alternatively, or in addition, a microwave signal (e.g., pulse) can be used to entangle one or more qubits. Much of the process is performed in a cold environment (e.g., in a cryogenic chamber), while the microwave signal of a qubit is ultimately measured at room temperature.

The amplitude and/or phase of the returned/output microwave signal carries information about the qubit state, such as whether the qubit has dephased to the ground or excited state. The microwave signal carrying the quantum information about the qubit state is usually weak (e.g., on the order of a few microwave photons). To measure this weak signal with room temperature electronics (i.e., outside the refrigerated environment), low-noise quantum-limited amplifiers (QLAs), such as Josephson amplifiers and travelling-wave parametric amplifiers (TWPAs), may be used as preamplifiers (i.e., first amplification stage) at the output of the quantum system to boost the quantum signal, while adding the minimum amount of noise as dictated by quantum mechanics, in order to improve the signal to noise ratio of the output chain. In addition to Josephson amplifiers, certain Josephson microwave components that use Josephson amplifiers or Josephson mixers such as Josephson circulators, Josephson isolators, and Josephson mixers can be used in scalable quantum processors. Accordingly, Josephson Junctions are salient circuit elements of a superconducting quantum computer. A Josephson Junction may include a thin layer of insulator, sometimes referred to as a barrier or a tunnel barrier, between two layers of superconductor. The Josephson Junction acts as a superconducting tunnel junction.

Materials to make the interconnects include, without limitation, niobium (Nb), aluminum (Al), niobium nitride (NbN), titanium nitride (TiN), niobium titanium nitride (NbTiN), etc., sometimes referred to herein as superconductors. It will be understood that other suitable materials that have superconducting properties can be used as well.

The inventors have recognized that to increase the computational power and reliability of a quantum computer in general, and superconductor structures in particular, improvements can be made in superconductor device structures and manufacture of the same. Achieving low error rates and better reliability is relevant, among other aspects, to manipulate qubit states accurately and perform sequential operations that provide consistent results and not merely unreliable data. Quantum technology is still a developing field and providing structures with highly predictable and more ideal performance is a challenge. Scalability of quantum computers going beyond a few hundred qubits with regard to the classical electronics used to read qubits limits the power consumption of low-noise amplifiers, due to the limited cooling power in cryogenic systems. When LNAs operate at extremely low (e.g., <1 mW) power levels, the noise temperature degrades because the gain of an active component in the LNA decreases. For example, 1,000 qubit systems may require at least 100 LNAs, each consuming approximately 5 mW of power. As the number of qubits increase in a system, the power burden in a cryogenic environment may be too high.

A conventional high-electron-mobility transistor (HEMT), sometimes also referred to as heterostructure FET (HFET) or modulation-doped FET (MODFET), is a field-effect transistor that includes a junction between two materials with different band gaps (i.e., a heterojunction) as the channel instead of a doped region. Conventional HEMT transistors have a "T-gate" structure, where the gate is of uniform material. A T-gate provides a separation between the gate metal and the source and drain of the transistor (e.g., N+ contacts) thereby reducing the parasitic capacitance between the gate and the source and drain. Such reduction in capacitance is salient in high frequency components that are sensitive to such parasitics (e.g., unwanted capacitance, resistance, and inductance). Also important is to minimize the parasitic resistance associated with the gate metal. By virtue of using a T shaped gate, the resistance of the gate is reduced (i.e., because now has more conductive material), which in turn increases capacitance due to the larger cross-sectional area of the gate.

To avoid a trade-off between the power consumption and noise properties of transistors of circuits that support quantum technology, such as LNAs, efforts to optimize the noise properties for ultra-low power LNAs are salient. Equation 1 below provides a maximum oscillation frequency of a transistor that, for example, can be used in an LNA. Equation 1 below provides the highest frequency at which you can have power gain.

$$f_{max} = \sqrt{\frac{f_T}{8\pi R_G C_{gd}\left[1 + \frac{2\pi f_T}{C_{gd}}\right]\Psi}}$$

Where:
  $R_G$ is a resistance of the gate;
  $C_{GD}$ is a gate to drain capacitance;
  $f_T$ is a transition frequency; and
  $\Psi$ represents a complex function of parasitics.

This expression shows that to achieve optimal gain in an LNA, both the gate resistance and the parasitic capacitances should be minimized.

The expression of equation 1 reveals that to achieve optimal gain in an LNA, in one embodiment, both the gate resistance and the parasitic capacitances should be minimized. LNAs that operate in cryogenic environments are typically tailored for low temperature by bias point tuning and circuit design. The noise temperature of the HEMT is provided by the expressions below:

$$T_{min} \approx 2\frac{f}{f_T}\sqrt{R_G T_g T_d G_d} \qquad \text{(Eq. 2)}$$

-continued $$T_{min} \propto \frac{\sqrt{I_{DS}}}{g_m} \quad \text{(Eq. 3)}$$

Where:

$T_{min}$ is the minimum noise temperature;
$T_d$ is the drain temperature;
$G_d$ is and the output conductance;
$I_{DS}$ is the drain to source current.

It is difficult to reduce both power consumption and noise concurrently. In order to realize LNAs with sufficiently low noise temperature under ultra-low power operation, the inventors have identified that the parasitic gate resistance should be minimized, since any excessive resistance contributes to the thermal noise. As mentioned above, in some scenarios, in order to reduce the gate resistance, a T-shaped gate can be used. The fabrication process for the T-gate is demanding, especially at small gate dimensions (e.g., a few hundred nanometer and smaller), and large T-gates contribute parasitic capacitances.

The teachings herein provide a transistor device with a superconducting gate having a novel "I" shape, fabricated through the novel fabrication process discussed herein provide meaningful benefits over other structures and methods. In one aspect, the use of superconductor material in the gate electrode provides both control of parasitic resistance and capacitance when operated at a temperature below Tc, the critical temperature of the superconductor. A complex T-gate formation architecture and process are no longer needed. A smaller gate hat size lowers the parasitic gate capacitance. A low parasitic gate resistance and capacitance achieve a low noise performance, low power consumption, and relatively high gain, thereby facilitating scalability of quantum computers that meet the demands of advanced transistor architectures, that can be used, for example, as high speed and low power LNAs. The techniques described herein may be implemented in a number of ways. Example implementations are provided below with reference to the following figures.

Example Superconducting Transistor Structure

Reference now is made to FIG. 1, which is a simplified cross-section view of a superconductor gate semiconductor field-effect transistor 100, consistent with an illustrative embodiment. To facilitate the present discussion, the semiconductor structures herein will sometimes be discussed in the context of a HEMT, while it will be understood that other types of high frequency transistors, such as metal-oxide-semiconductor field-effect transistors are supported as well.

The semiconductor structure 200, may include a substrate 102. In various embodiments, the substrate 102, may comprise any suitable material or combination of materials, such as doped or undoped silicon, glass, dielectrics, etc. For example, the substrate may comprise a semiconductor-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating films on top.

Other materials that may be used for the substrate include, without limitation, sapphire, aluminum oxide, germanium, gallium arsenide (GaAs) or any of the other III-V periodic table compounds, indium phosphide (InP), silicon carbide (SiC), a superconducting alloy of silicon and germanium, quartz, etc. Thus, as used herein, the term substrate 102 refers to a foundation upon which various superconducting structures can be built.

There are several epitaxial layers on top of the substrate 102. More specifically, there is a buffer layer 104 on top of the substrate 102. In one embodiment, the buffer layer is Indium-Aluminum-Arsenide (InAlAs). There is a quantum well channel layer 106 on top of the buffer layer 104. In one embodiment, the quantum well channel 106 is Indium-Gallium-Arsenide (InGaAs). There is a barrier layer 120 on top of the quantum well channel 106. In one embodiment, the barrier layer is the same as that as the buffer layer 104 (e.g., Indium-Aluminum-Arsenide (InAlAs)).

There is a drain 124A having an electrode, as well as a source 124B having an electrode, on top of the barrier layer 120. The drain and source are collectively referred to herein as the contacts 124. Both the drain 124A and source 124B contacts are coplanar with each other. In one embodiment, the drain and source contacts 124A, 124B comprise a n+ InGaAs capping layer. As used herein, the term "capping" refers to the layer being on top of the quantum well stack, i.e., the channel and barrier. In the example of FIG. 1, the contacts 124A and 124B each have a tapered portion, thereby increasing the distance in the gap between the drain 124A and the source 124B the higher the height of the contacts 124A and 124B.

There is a gate structure on top of the barrier 120, between the drain 124A and the source 124B contacts, sometimes referred to herein as an "I" gate. The gate structure includes a vertical center portion 602 having a bottom surface coplanar with the drain 124A and source 124B contacts. At least one of the left portion 802A and/or the right portion 802B comprises a superconducting material. In one embodiment, the superconducting material is titanium nitride (TiN) having a lateral width that is at or below 50 nm (e.g., 20 nm to 50 nm each). By virtue of having such a low lateral width, the capacitance of the gate structure is substantially reduced, which allows for higher frequency operation.

In one embodiment, the drain 124A and source 124B contacts have an ohmic metal, such as a combination of titanium and gold layers, 1102A and 1102B on top, respectively. There is a silicon dioxide ($SiO_2$) layer 226A on top of the drain contact 124A and between the ohmic contact 1102A of the drain and the center portion of the gate 602. Similarly, the $SiO_2$ layer 226B on top of the source contact 124 and between the ohmic contact 1102B of the source and the center portion of the gate 602.

The superconducting transistor 100 can be used to implement various components, including, without limitation, LNAs that operate in cryogenic environments, discussed in more detail later.

Example Processes for Superconducting Structures

Figure 2:
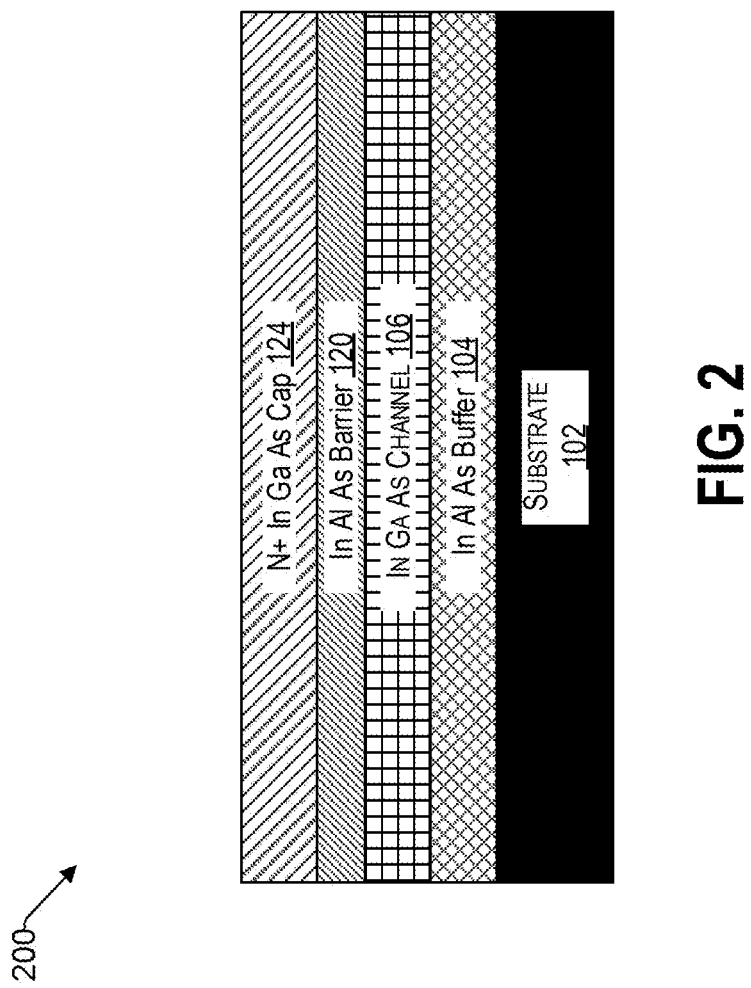
FIG. 2 illustrates a cross-section of a semiconductor structure before formation of a gate, drain or source, consistent with an illustrative embodiment.

With the foregoing description of an example superconductor gate semiconductor field-effect transistor 100, it may be helpful to discuss an example process of manufacturing the same. To that end, FIGS. 2 to 12 illustrate various steps in the manufacture of a superconductor structure, consistent with illustrative embodiments. More specifically, FIG. 2 illustrates a cross-section of a semiconductor structure 200 before formation of a gate drain or source, consistent with an illustrative embodiment. FIG. 2 includes a substrate 102 having various epitaxial layers. The epitaxial layers include a buffer layer 104 on top of the substrate 102. In one embodiment, the buffer layer is Indium-Aluminum-Arsenide (InAlAs). There is a quantum well channel layer 106 on top of the buffer layer 104. In one embodiment, the quantum well channel 106 is Indium-Gallium-Arsenide (In-GaAs). There is a barrier layer 120 on top of the quantum well channel 106. In one embodiment, the barrier layer is the same as that as the buffer layer 104 (e.g., Indium-Aluminum-Arsenide (InAlAs)).

There is a cap layer 124, sometimes referred to herein as the contact layer on top of the barrier layer 120. The cap layer 124 can be used to ultimately form one or more drain contacts and one or more source contacts, discussed in more detail later. In one embodiment, contact layer 124 comprises n+ InGaAs. In one embodiment, epitaxial layers 104 to 124 are each constructed by molecular-beam epitaxy (MBE) that takes place in a high or even ultra-high vacuum (e.g., $10^{-8}$ to $10^{-12}$ Torr).

Figure 3:
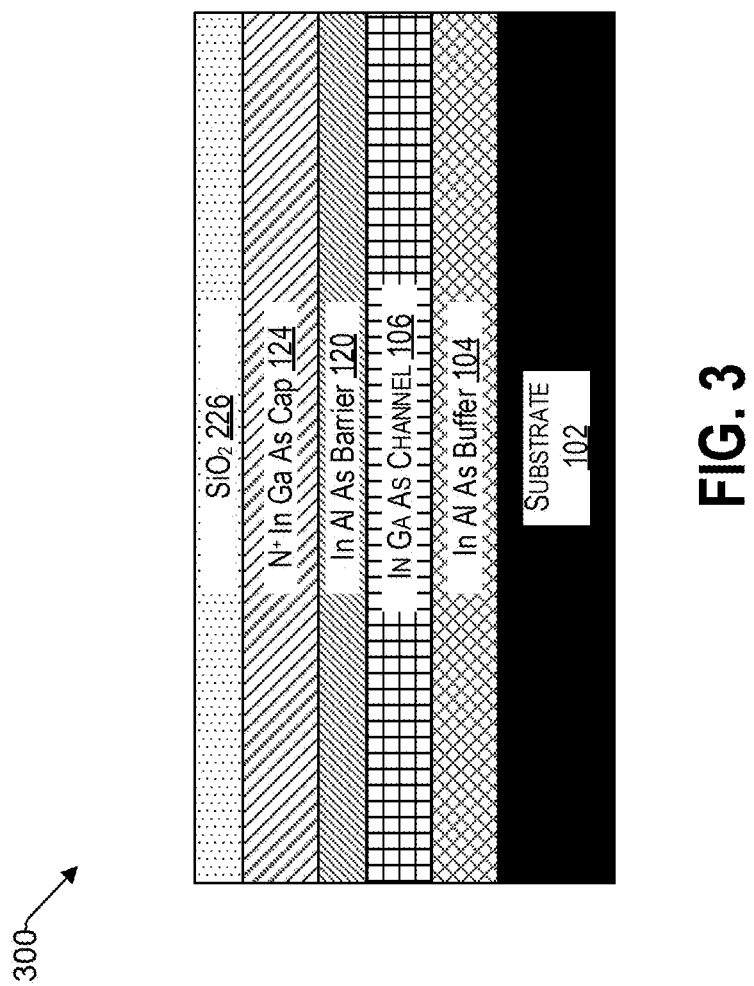
FIG. 3 is a cross-section view of a semiconductor structure after a deposition of silicon dioxide ($SiO_2$), consistent with an illustrative embodiment.

FIG. 3 is a cross-section view of a semiconductor structure 300 after a deposition of silicon dioxide ($SiO_2$), consistent with an illustrative embodiment. In one embodiment of FIG. 3, the $SiO_2$ layer 226 is 10 nm thick and is deposited by atomic layer deposition (ALD). The precursors to the $SiO_2$ layer may include silicon tetrachloride ($SiCl_4$) and water $H_2O$.

Figure 4:
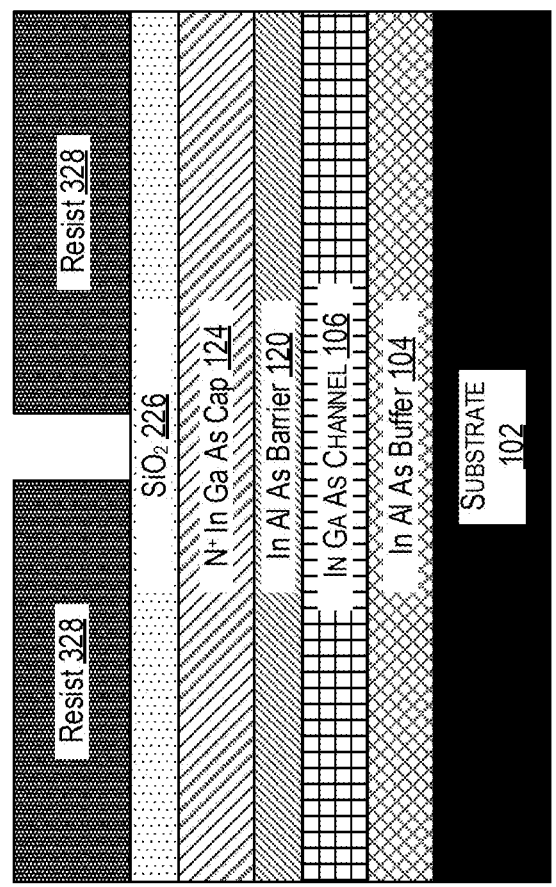
FIG. 4 is a cross-section view of a semiconductor structure having a photoresist layer, consistent with an illustrative embodiment.

FIG. 4 is a cross-section view of a semiconductor structure 400 having a photoresist layer 328, consistent with an illustrative embodiment. For example, as is understood by those of ordinary skill in the art, a mask layer (not shown), sometimes referred to as a photomask, may be provided by forming a layer of photoresist material on the amorphous $SiO_2$ layer 226, exposing the photoresist material to a pattern of light, and developing the exposed photoresist material. In various embodiments, the photoresist may comprise poly methyl methacrylate (PMMA) or Zeon electron beam positive-tone ZEP resist can be used. The developer can be a mixture of methyl isobutyl ketone and isobutanol, or Oxylene. In this way, a gate footprint (e.g., 30 nm to 300 nm) can be defined).

Figure 5:
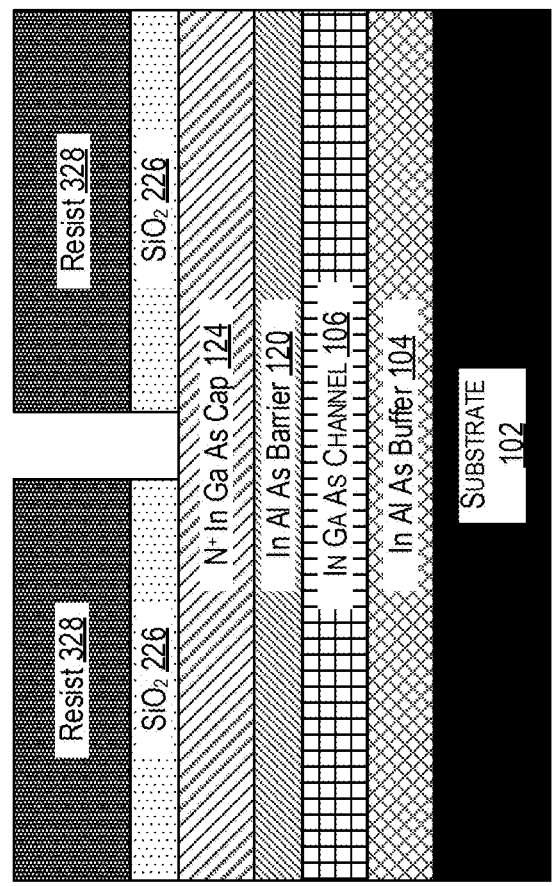
FIG. 5 is a cross-section view of a semiconductor structure having a portion of the amorphous $SiO_2$ layer removed, consistent with an illustrative embodiment.

FIG. 5 is a cross-section view of a semiconductor structure 500 having a portion of the amorphous $SiO_2$ layer 226 removed, consistent with an illustrative embodiment. A dry etching process, such as a reactive ion etch (RIE) using the combination $CF_4/Ar/H_2$, may be used to form patterns (e.g., openings) by removing portions of the amorphous $SiO_2$ layer 226, up to the top surface of the contact layer 124.

Figure 6:
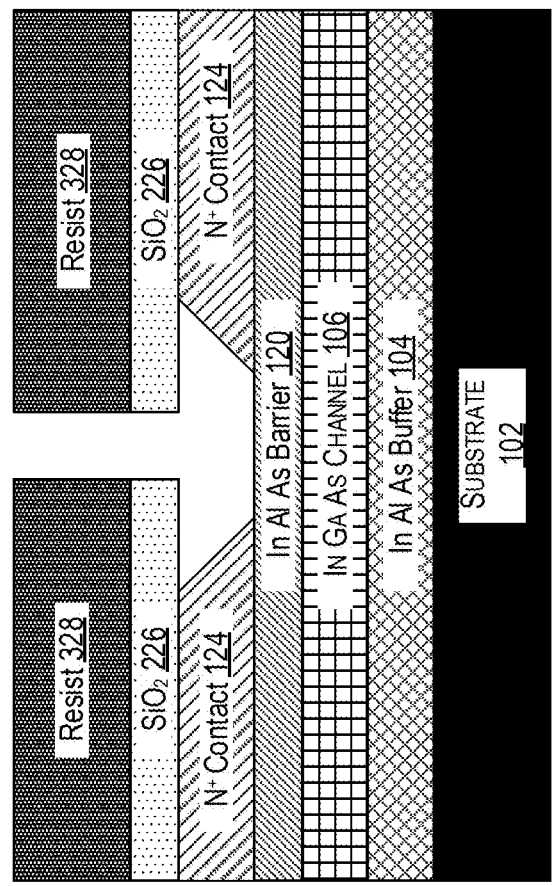
FIG. 6 is a cross-section view of a semiconductor structure after a removal of a portion of the contact layer, consistent with an illustrative embodiment.

FIG. 6 is a cross-section view of a semiconductor structure 600 after a removal of a portion of the contact layer 124, consistent with an illustrative embodiment. More specifically, a gate recess cavity is created, thereby separating the left contact (e.g., drain) from the right contact (e.g., source) by way of wet etching of the contact layer 124 (e.g., comprising n+ InGaAs). In one embodiment citric acid ($H_2O_2$) can be used as the etchant material. For the resultant Schottky contact between the gate and the quantum well, a contact with a non-doped barrier should be used, in this embodiment the InAlAs barrier, so the highly doped cap (contact) layer 124 is selectively etched prior to gate deposition.

Figure 7:
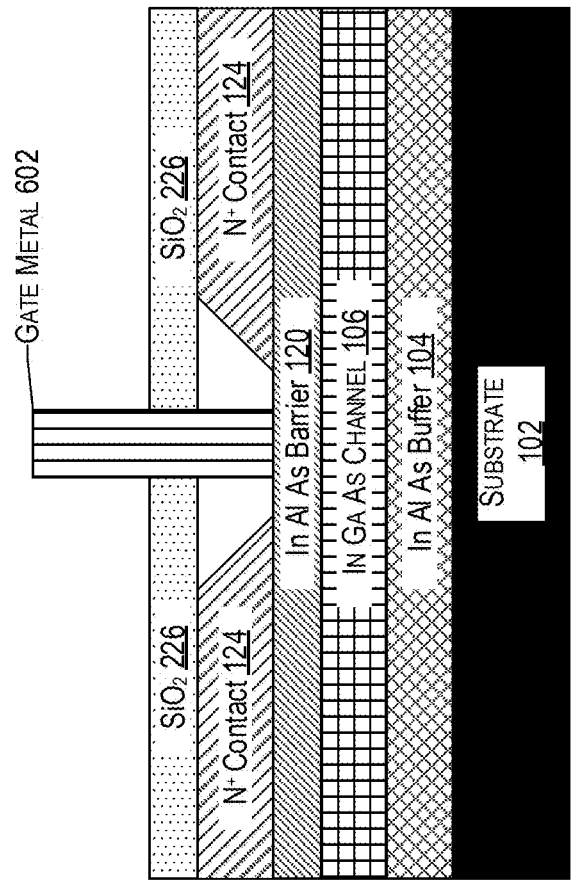
FIG. 7 is a cross-section view of a semiconductor structure having a metal gate, consistent with an illustrative embodiment.

FIG. 7 is a cross-section view of a semiconductor structure 700 having a metal gate, consistent with an illustrative embodiment. After etching, the resist 328 layer may be removed using a conventional plasma ashing or stripping process. A gate metal 602 can then be deposited reaching from the top surface of the barrier layer 120 to above the $SiO_2$ layer 226. The gate metal can be deposited by an evaporation and lift-off resist process. In various embodiments, the solvent for the lift-off is NMP or Anisol. Accordingly, in contrast to T gates of HEMT, the semiconductor structure 700 has an I gate structure. In various embodiments, the gate metal 602 comprises titanium (Ti), platinum (Pt), or gold (Au) having a thickness of 20 nm, 10 nm, or 30 nm, respectively. These metals provide a good adhesion to the barrier layer 120 and provide appropriately low resistance. The gate metal 602 is self-aligned.

Figure 8:
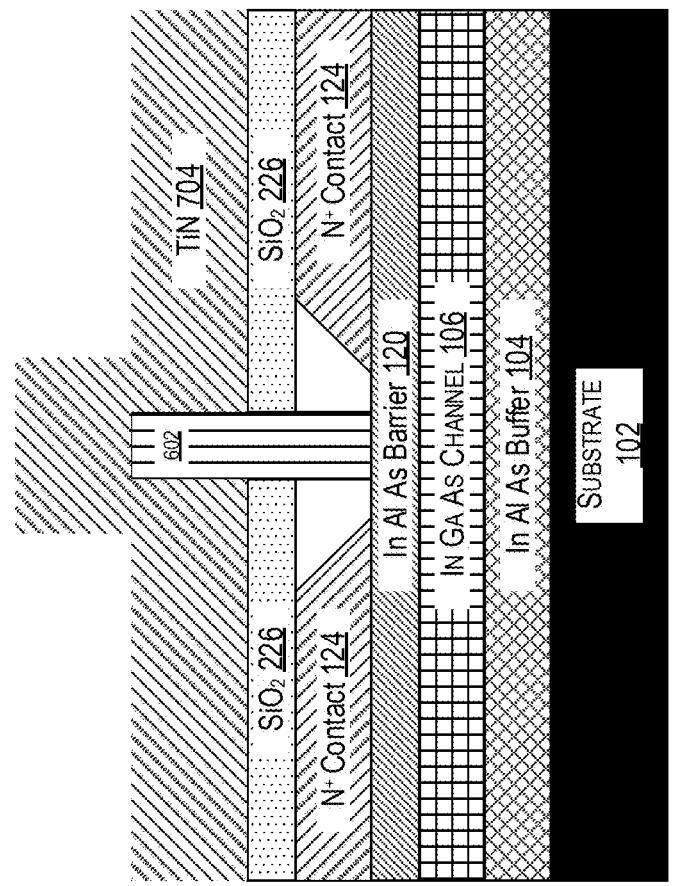
FIG. 8 is a cross-section view of a semiconductor structure having titanium nitride (TiN) layer on top of the $SiO_2$ layer and the gate, consistent with an illustrative embodiment.
Figure 9:
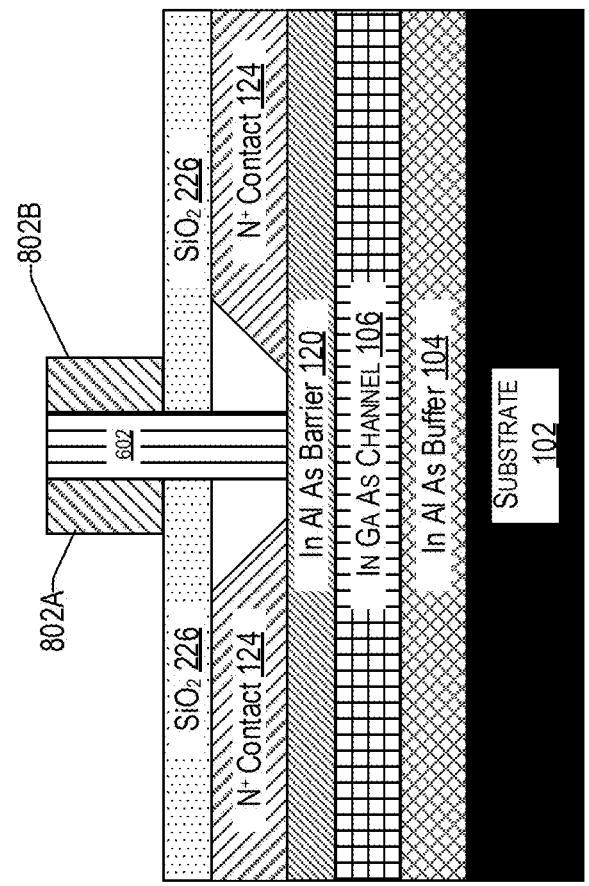
FIG. 9 is a cross-section view of a semiconductor structure after an etching of portions of the TiN of FIG. 8, consistent with an illustrative embodiment.

Introducing a superconducting material at this juncture of the process is challenging because superconducting materials involve sputtering as deposition. For example, niobium or niobium nitride can be sputtered at a relatively high temperature. For example, high temperature (e.g., >400 C) can make a lift off process using resists difficult since resists are heat sensitive. Sputtering is also difficult to combine with lift-off since it tends to give conformal metal coverage, which is not compatible with lift-off. Accordingly, a superconducting metal would be cumbersome to implement. In this regard, reference is made to FIG. 8, which is a cross-section view of a semiconductor structure 800 having titanium nitride (TiN) layer 704 on top of the $SiO_2$ layer 226, consistent with an illustrative embodiment. In one embodiment, the TiN is deposited by ALD, which is preferred over sputtering because it is uniform, substantially more controllable and provides a desired coverage around the structure, as illustrated in FIG. 8. The TiN layer 704 can have a thickness of 30 nm. The TiN is a superconducting material at sufficiently low temperatures. To form the TiN layer using ALD, $TiCl_4$ and $NH_3$ can be used as the gas phase precursors FIG. 9 is a cross-section view of a semiconductor structure 900 after an etching of portions of the TiN of FIG. 8, consistent with an illustrative embodiment. For example, the TiN layer 704 can be etched by way of ME using a $Cl_2/Ar$ plasma. In this way, the gate 602 has a side gates 802 comprising superconductor material on its top portion (i.e., above the $SiO_2$) layer 226, together creating an I gate structure.

Figure 10:
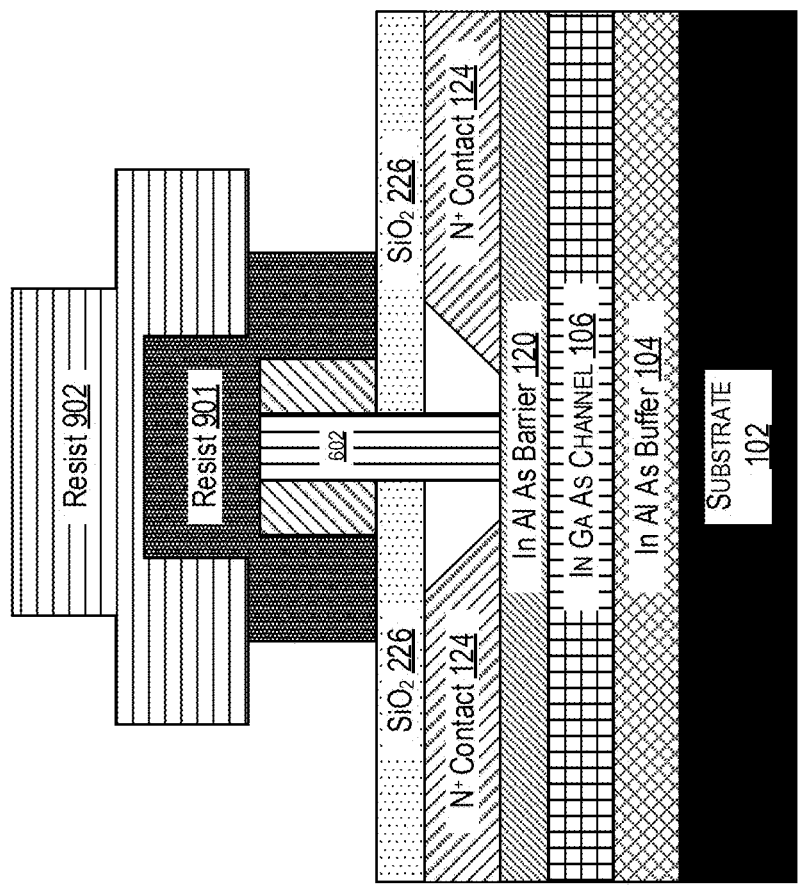
FIG. 10 is a cross-section view of a semiconductor structure having two resist levels and, consistent with an illustrative embodiment.

FIG. 10 is a cross-section view of a semiconductor structure 1000 having two resist levels 901 and 902, consistent with an illustrative embodiment. The Ohmic resist layers 901 and 902 can be used to create ohmic contacts on top of the drain and source, discussed in more detail later. To that end, electron beam lithography (EBL) can be used to draw a custom shape on a surface of the $SiO_2$ 226 gate 602 and side gate 802 with an electron-sensitive film (i.e., resist 901). Subsequently, another photoresist layer 902 is deposited on top of the first photoresist layer 901. The resist layers 901 and 902 are collectively referred to herein as a bi-layer photoresist. The bottom resist layer forms undercuts that enable a lift-off process of the source and drain metals. An example of such a resist stack is LOR3B and UV60, which is developed by MF-CD26.

Figure 11:
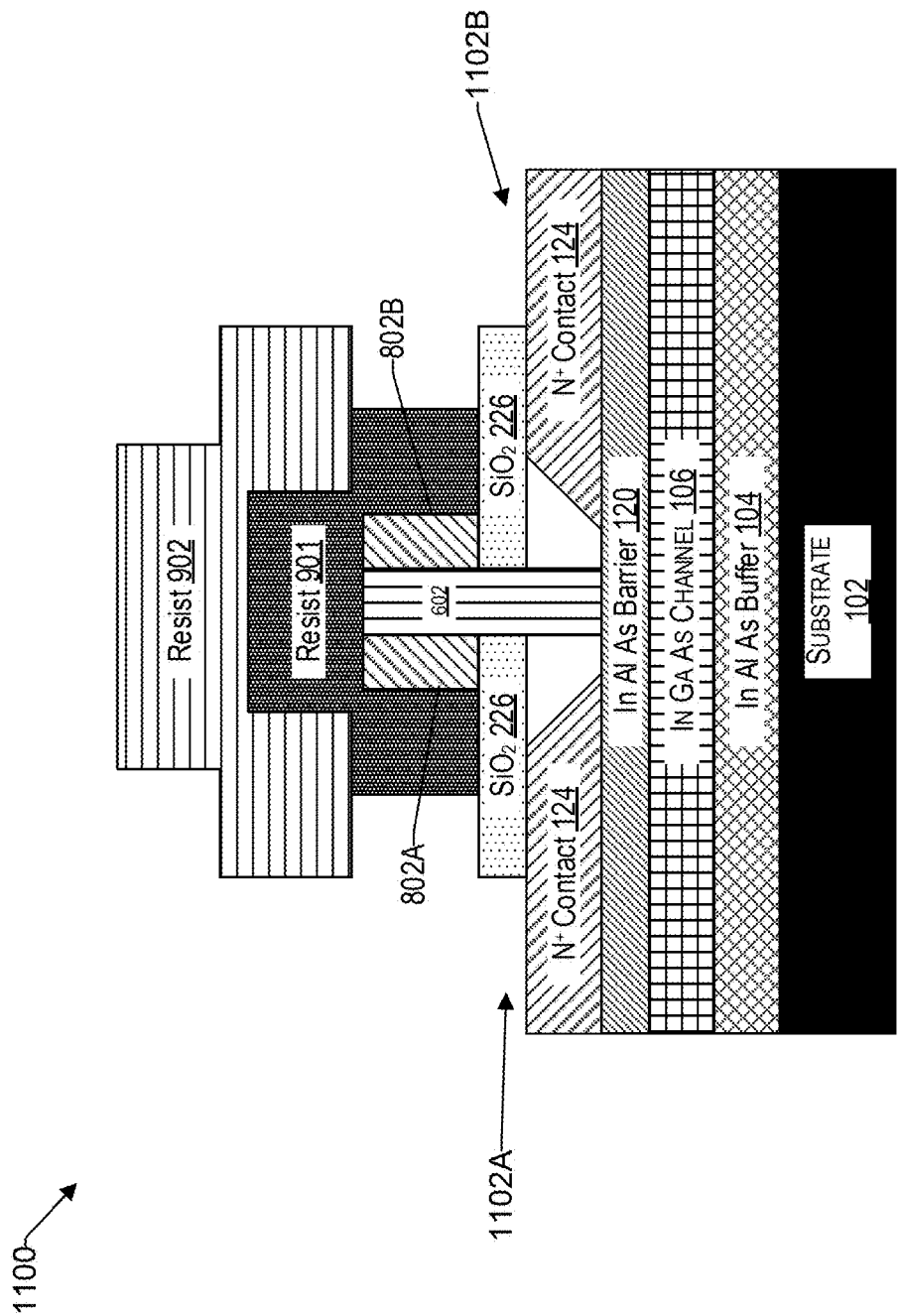
FIG. 11 is a cross-section view of a semiconductor structure after an anisotropic etching, consistent with an illustrative embodiment.

FIG. 11 is a cross-section view of a semiconductor structure 1100 after an anisotropic etching, consistent with an illustrative embodiment. More specifically, the bi-layer photoresist 901 and 902 can be used to remove portions of the $SiO_2$ layer 226 in areas marked as 1102A and 1102B. To that end, anisotropic etching, such as ME using the combination $CF_4/Ar/H_2$ plasma can be used, thereby creating an opening for an ohmic contact region for the drain and source, respectively. After etching, the resist layers 901 and 902 may be removed using a conventional plasma ashing or stripping process. Accordingly, the pattern of the bi-layer photoresist 901, 902 layers facilitates the removal of the amorphous $SiO_2$ layer 226, in areas where the bi-layer photoresist 901, 902 has not been deposited, thereby leaving behind two regions 1102A and 1102B.

Figure 12:
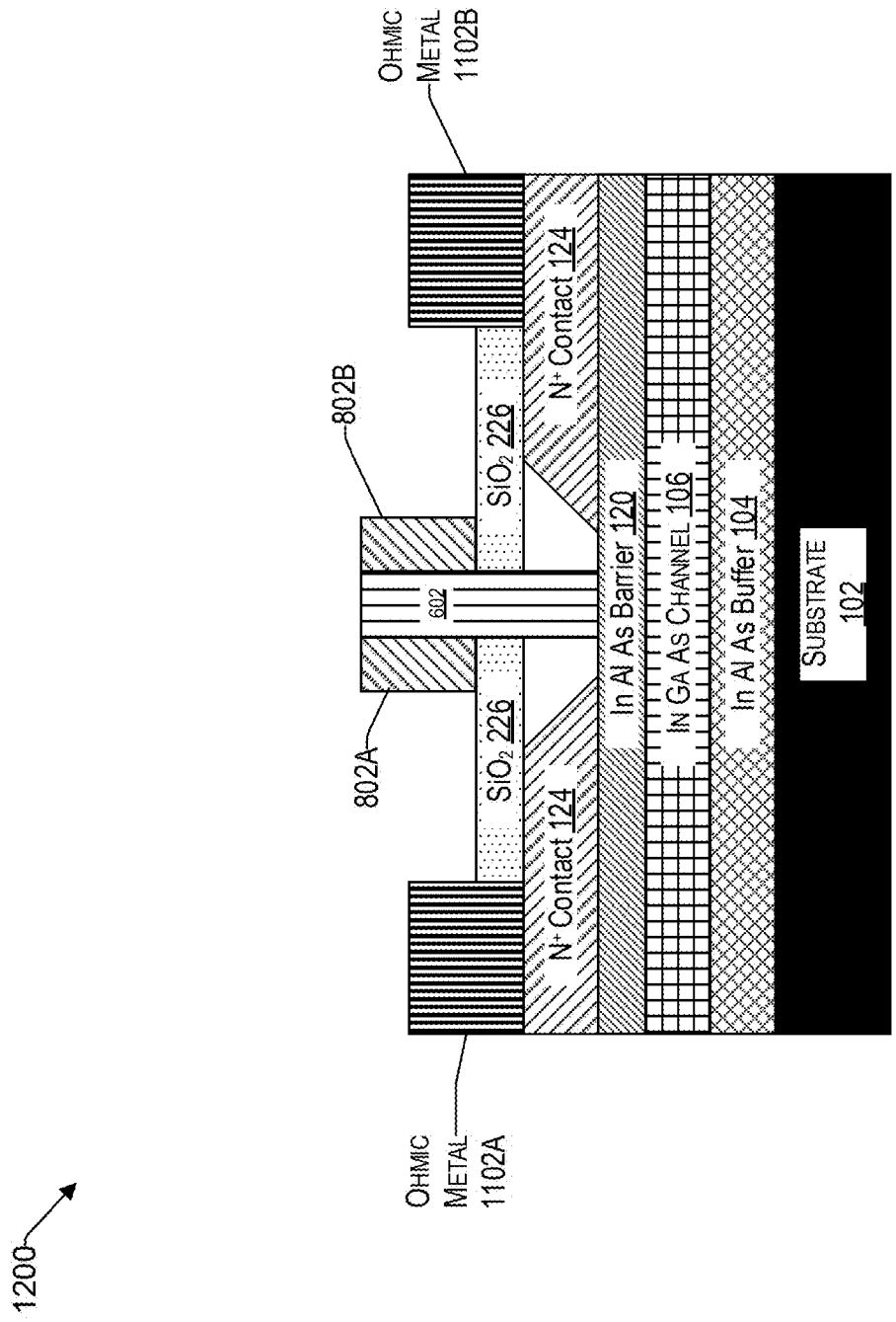
FIG. 12 is a cross-section view of a superconductor gate semiconductor field-effect transistor, consistent with an illustrative embodiment.

Reference now is made to FIG. 12, which is a cross-section view of a superconductor gate semiconductor field-effect transistor 1200, consistent with an illustrative embodiment. The transistor 1200 includes ohmic metal 1102A and 1102B that can be created by way of evaporation and lift-off process. In various embodiments, the ohmic metal 1102A and 1102B comprises titanium (Ti), platinum (Pt), or gold (Au) having a thickness of 10 nm, 40 nm, or 100 nm, respectively. Acetone can be used as a solvent for removal of the lift-off resists. For example, ohmic metal 1102A can be used as a drain and ohmic metal 1102B can be used as a source of the transistor 1200.

Significantly, by virtue of not having a T-gate, which can be hundreds of nm in lateral width (e.g., 500 nm to 600 nm), each left 802A or right 802B portion of the gate can be less than a tenth the width of a T-gate (e.g., lateral width of 20 nm to 50 nm each) thereby significantly reducing the capacitance of the gate structure 602/802A/802B, while providing a low gate resistance, such as less than 200 Ohm/mm.

FIGS. 13A to 13D provide different aspects of the superconductor gate semiconductor transistor 1200 of FIG. 12. More specifically, FIG. 13A provides an example LNA circuit that may use one or more transistors similar to that of FIG. 12, repeated in simplified form in FIG. 13D. The example LNA circuit 1302 includes a plurality of transistors 1304, 1306, and 1308 coupled in stages. The remaining components represent BEOL components, such as resistors and capacitors (as well as possible inductors—not shown), to provide a desired bandwidth of operation. For example, for qubit technology the desired bandwidth may be 4 GHz to 8 GHz.

FIG. 13B provides a top view of an example HEMT 1320 that may be used to implement one or more transistors similar to that of FIG. 12, consistent with an illustrative embodiment. FIG. 13C is a top photograph view of a HEMT 1330, consistent with an illustrative embodiment. The HEMT 1330 includes a region 1332, who's cross-section is depicted in FIG. 13D, which is consistent with the example cross-section view 1200 of FIG. 12.

While the manufacture of a single gate HEMT structure is described for the purposes of discussion, it will be understood that other types of transistors and number of gates are supported by the teachings herein. The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A superconductor transistor structure, comprising:
a buffer layer;
a quantum well channel layer on top of the buffer layer;
a barrier layer on top of the channel layer;
a drain contact on a channel stack;
a source contact on a channel stack; and
a superconducting gate structure located between the source contact and drain contact, comprising:
an active gate portion having a bottom surface coplanar with a bottom surface of the source and the drain contacts;
discrete superconducting portions in contact with, and adjacent to, an upper part of the active gate portion,
wherein the source and drain contacts each have a tapered shape facing the gate.

2. The superconductor transistor structure of claim 1, wherein:
the buffer layer is Indium-Aluminum-Arsenide (InAlAs);
the quantum well channel layer is Indium-Gallium-Arsenide (InGaAs); and
the barrier layer is Indium-Aluminum-Arsenide (InAlAs).

3. The superconductor transistor structure of claim 1, wherein the superconductor material is titanium nitride (TiN).

4. The superconductor transistor structure of claim 1, wherein a width of the superconductor material of a left portion and a right portion of the gate structure are each below 50 nm.

5. The superconductor transistor structure of claim 1, further comprising:
a dielectric layer between the drain contact and the left portion of the gate structure; and
a dielectric layer between the source contact and the right portion of the gate structure.

6. The superconductor transistor structure of claim 1, wherein the gate structure is I shaped.

7. The superconductor transistor structure of claim 1, wherein the source and drain contacts comprise a n+ Indium-Gallium-Arsenide (InGaAs) capping layer.

8. The superconductor transistor structure of claim 1, wherein the superconductor transistor structure is a high-electron-mobility transistor (HEMT) and part of a low noise amplifier configured to operate in a cryogenic environment.

* * * * *